United States Patent [19]

Takeshita

[11] Patent Number: 4,559,494
[45] Date of Patent: Dec. 17, 1985

[54] MAXIMUM DEMAND METER

[75] Inventor: Shigeki Takeshita, Fukuyama, Japan

[73] Assignee: Mitsubishi Denki Kabushiki Kaisha, Tokyo, Japan

[21] Appl. No.: 498,167

[22] Filed: May 25, 1983

[30] Foreign Application Priority Data

May 27, 1982 [JP] Japan .................................. 57-91648
Apr. 13, 1983 [JP] Japan .................................. 58-66511

[51] Int. Cl.⁴ ............................................ G01R 11/64
[52] U.S. Cl. .......................... 324/103 R; 235/144 MA
[58] Field of Search ....................... 324/103 R, 103 P; 235/144 MA

[56] References Cited

U.S. PATENT DOCUMENTS

| 1,077,749 | 11/1913 | Porter | 324/103 R |
| 1,138,786 | 5/1915 | Porter | 324/103 R |
| 1,764,340 | 8/1927 | Oman | 324/103 R |
| 3,325,732 | 6/1967 | Brown | 324/103 R |

FOREIGN PATENT DOCUMENTS

| 250361 | 10/1912 | Fed. Rep. of Germany . | |
| 654913 | 1/1938 | Fed. Rep. of Germany | 324/103 R |
| 1100160 | 2/1961 | Fed. Rep. of Germany . | |
| 2115797 | 10/1972 | Fed. Rep. of Germany . | |
| 54-8564 | 1/1979 | Japan | 324/103 R |
| 329855 | 6/1958 | Switzerland | 324/103 R |

Primary Examiner—Stewart J. Levy
Assistant Examiner—Stephen M. Baker
Attorney, Agent, or Firm—Oblon, Fisher, Spivak, McClelland & Maier

[57] ABSTRACT

A maximum demand meter comprises a driving part for transmitting a rotation depending on a consumed electric energy, a differential gear mechanism comprising a first sun gear rotated by the driving part in a predetermined direction, a second sun gear driven in the opposite direction of the rotation of the first sun gear and a planet gear for transmitting the rotations of the first and second sun gears to a push arm for moving a pointer, a zero-returning driving part for rotating the second sun gear of said differential gear mechanism in a predetermined direction and an engaging pawl means for inhibiting either of the first and second sun gears of the differential gear mechanism from rotating in a predetermined direction. In normal state, the engaging pawl means inhibits the second sun gear from rotation and allows the rotation of the first sun gear to rotate the planet gear thereby to forwardly move the push arm and at a demand time, the engaging pawl means inhibits the first sun gear from the rotation and allows the second sun gear to rotate and the zero-returning driving means drives the second sun gear to rotate the planet gear thereby to return the push arm to the zero position.

15 Claims, 3 Drawing Figures

FIGURE 1 *PRIOR ART*

MAXIMUM DEMAND METER

The present invention relates to a maximum demand meter for indicating the maximum value of electric power in an average power for each predetermined time period.

As this type of the device, there has so far been known such one as shown in FIG. 1. In FIG. 1, the reference numeral 1 designates a step motor which is electrically connected to an oscillation circuit (not shown) of an integrating wattmeter with an oscillation to be separately placed and receives a pulse signal, in proportion to a consumed electric energy, fed from the oscillator thereby to perform a rotary movement in proportion to the consumed electric energy; the numeral 2 designates the output shaft of the step motor 1; 3 designates a first gear wheel fitted to the output shaft 2; 4 designates a gear train for transmitting orderly the revolution of the first gear wheel 3 according to the gear ratio; the numeral 13 designates the final stage gear wheel rotated by the gear train; the numeral 14 designates a flange engaged with an end 15a of a trip arm 15 and the flange is formed in one-piece with a first clutch plate 12 and the final stage gear wheel 13.

The reference numeral 17 designates a second clutch plate which is normally urged to be in contact with the first clutch plate 12 by a compression spring 24; the numeral 18 designates a push arm fixedly mounted on the second clutch plate; the numeral 19 designates a demand pointer urged forwardly by an end 18a of the push arm 18; the numeral 20 designates a zero-returning spring fixed to the other end 18b of the push arm and the other end of the spring is secured to a fixed pole 21. The numeral 22 designates a scale plate having a scale of demand power on which the demand pointer 19 is slidable with some friction substantially in line with the revolution center of the push arm 18. The numeral 23 designates a zero-position adjusting screw which allows adjustment of the one end 18a of the push arm 18 to be in contact with an edge surface of the demand pointer when the demand pointer 19 indicates zero KW on the scale plate 22. The first and second clutch plates 17, 12 and the compression spring 24 are loosely fitted to a shaft 25.

The flange 14 is provided in such a manner that application of a force to an end 15b of a trip arm 15 in the arrow mark direction for a certain time period urges the flange 14 in the arrow mark direction against the spring force of the compression spring 24 by the action of the other end 15a moving around a fulcrum point 15c. Namely, the construction is made to detach the first and second clutch plates 12, 17 from each other.

The operation of the conventional maximum demand wattmeter will be described.

When the step motor 1 receives a pulse signal in proportion to the consumed electric energy fed from the oscillation circuit of the integrating wattmeter with an oscillator, it rotates in response to the pulse signal to rotate the first gear wheel 3, hence the final stage gear wheel 13 through the gear train. The revolution of the final stage gear wheel 13 is transmitted to the push arm 18 by means of the first and second clutch plates 12, 17 and the one end 18a of the push arm moves forwardly the demand pointer 19 while the other end 18b of the push arm rotates so as to wind the zero-returning spring 20.

After a predetermined time has lapsed, such as fifteen minutes, thirty minutes or sixty minutes etc., the end 15b of the trip arm 15 is applied for only a short time with a force in the arrow mark direction to act the flange 14 so that the first clutch plate 12 is shifted in the direction to disengage the first and second clutch plates 12, 17 against the spring force of the compression spring 24. The application of the force is performed by utilizing the revolution of a synchronous motor rotating with a constant speed under a rated voltage and a rated frequency and by a combination of a cam and a rotating pawl which applies a force as shown by the arrow mark for only a short time upon reaching a predetermined time. The mechanism is referred to as a timing device (not shown).

Thus, during a short time (usually about 2–4 seconds) of application of the force to the one end 15b of the trip arm, the first and second clutch plates are disengaged and the second clutch plate 17 achieves a freely rotatable state. Accordingly, the push arm 18 is rapidly returned to the zero position by the rewinding torque of the zero-returning spring 20. On the other hand, the demand pointer 19 remains at a forward position brought by the push arm 18 because there is a frictional force at the revolution center part.

When the timing device above mentioned is actuated so that a force is applied to the end 15b of the trip arm to release a force for disengaging the first and second clutch plates, they are thereby brought into engagement and the push arm 18 again begins its forward movement in proportion to the revolution of the step motor 1 in the same manner as described above. However, the demand pointer 19 is moved forwardly only when an electric energy consumed in a time period is greater than the maximum electric energy in the past time and otherwise, the push arm 18 returns to the zero position without contacting to the demand pointer 19. Thus, the demand pointer 19 indicates the maximum value in the average power for each time period.

There is normally provided a device which forcibly returns the demand pointer from the outside after data indicated by the demand pointer are read at an appropriate interval of time such as once a month. The meter is thereby operable for the next month.

The conventional maximum demand meter is so constructed as described above that the push arm is moved forwardly while winding the zero-returning spring by the revolution of the step motor with the result that a large torque is needed for the step motor which necessarily results in a large sized and expensive device.

The foregoing description concerns a so-called separation and pulse signal type maximum demand meter in which a demand pointer is moved by a pulse signal fed from an oscillation circuit of an integrating wattmeter with an oscillator. There is also found a disadvantage in a so-called one-body type maximum demand meter in which a demand pointer is directly moved by a driving torque of the rotary circular plate of an induction type integrating wattmeter and a push arm is moved forwardly while winding a zero-returning spring. The disadvantage of the device is as follows: the driving torque of an integrating wattmeter is not so large, as is well-known and particularly, in a light loading condition, frictional torque produced in rotary parts such as a bearing, a rotor, a metering device etc., acts as a damping force. Accordingly, effect of the frictional force is not negligible and must be therefore minimized. However, it is impossible to reduce it to zero. Heretofore, there has been made an attempt that a torque for compensating the frictional torque is added by using a light load adjusting device to improve a performance in the light loading condition. However, when an excessive compensating torque is applied, there results a so-called creeping phenomenon that the circular plate of an integrating wattmeter rotates by merely applying voltage to cause malmeasurement whereby it is inhibited to generally use the compensating torque by the light load adjusting device.

In the integrating wattmeter mentioned above, it is clearly not desirable from the afore-mentioned description to add an additional burden of the winding torque of the zero-returning spring and a light load performance becomes inferior. On the other hand, when the winding torque of the zero-returning spring is insufficient, zero-returning movement of the push arm becomes unstable to hinder correct measurement. To improve this, there has been proposed to amplify a torque of the rotary circular plate of an integrating wattmeter by a torque amplifying device so as to move a demand pointer. However, the proposed device has disadvantages that the device is large-sized, complicated, increasing in break down rate and expensive.

It is an object of the present invention to overcome the disadvantages of the conventional devices and to provide a maximum demand meter which is capable of moving forwardly and returning a push arm to the zero position correctly without necessity of requirement of a large torque in a driving part by using a differential gear mechanism.

The foregoing and the other objects of the present invention have been attained by providing a maximum demand meter which comprises a driving part for transmitting a rotation depending on a consumed electric energy, a differential gear mechanism comprising a first sun gear rotated by the driving part in a predetermined direction, a second sun gear driven in the opposite direction of the rotation of the first sun gear and a planet gear for transmitting the rotations of the first and second sun gears to a push arm for moving a pointer, a zero-returning driving part for rotating the second sun gear of the differential gear mechanism in a predetermined direction and an engaging pawl means for inhibiting either of the first and second sun gears of the differential gear mechanism from rotating in a predetermined direction, wherein in normal state, the engaging pawl means inhibits the second sun gear from rotation and allows the rotating of the first sun gear, to rotate the planet gear thereby to forwardly move the push arm, and at a demand time, the engaging pawl means inhibits the first sun gear from the rotation and allows the second sun gear to rotate, and the zero-returning driving means drives the second gear to rotate the planet gear, thereby to return the push arm to the zero position.

Another aspect of the present invention, there is provided a maximum demand meter which comprises a first differential gear mechanism comprising a first planet gear and first and second sun gears rotating in proportion to the rotation of the first planet gear, a gear train for transmitting the rotation of a rotary shaft rotating depending on a consumed electric energy to the first differential gear mechanism, a second differential gear mechanism comprising a third sun gear for receiving the rotation of the first sun gear, a fourth sun gear connected to a zero-returning driving part to be rotated in the opposite direction of the rotation of the third sun gear and a second planet gear for transmitting the revolutions of the third and fourth sun gears to a push arm, which forwardly moves a pointer, and an engaging pawl means being capable of inhibiting the sun gears of the first and second differential gear means from rotating in predetermined directions, wherein in normal state, the engaging pawl means inhibits the second and fourth sun gears from rotation and allows the rotations of the first and third sun gears to rotate the second planet gear thereby to forwardly move the push arm, and at a demand time, the engaging pawl means inhibits the first and third sun gears from rotation and allows the rotations of the second and fourth sun gears, and the zero-returning driving part drives the fourth sun gear to rotate the second planet gear, thereby to return the push arm to the zero position.

An embodiment of the present invention will be described on a maximum demand meter of a type that a demand pointer is directly driven by a driving torque of an induction type integrating wattmeter, with reference to FIG. 2.

Figure 2:
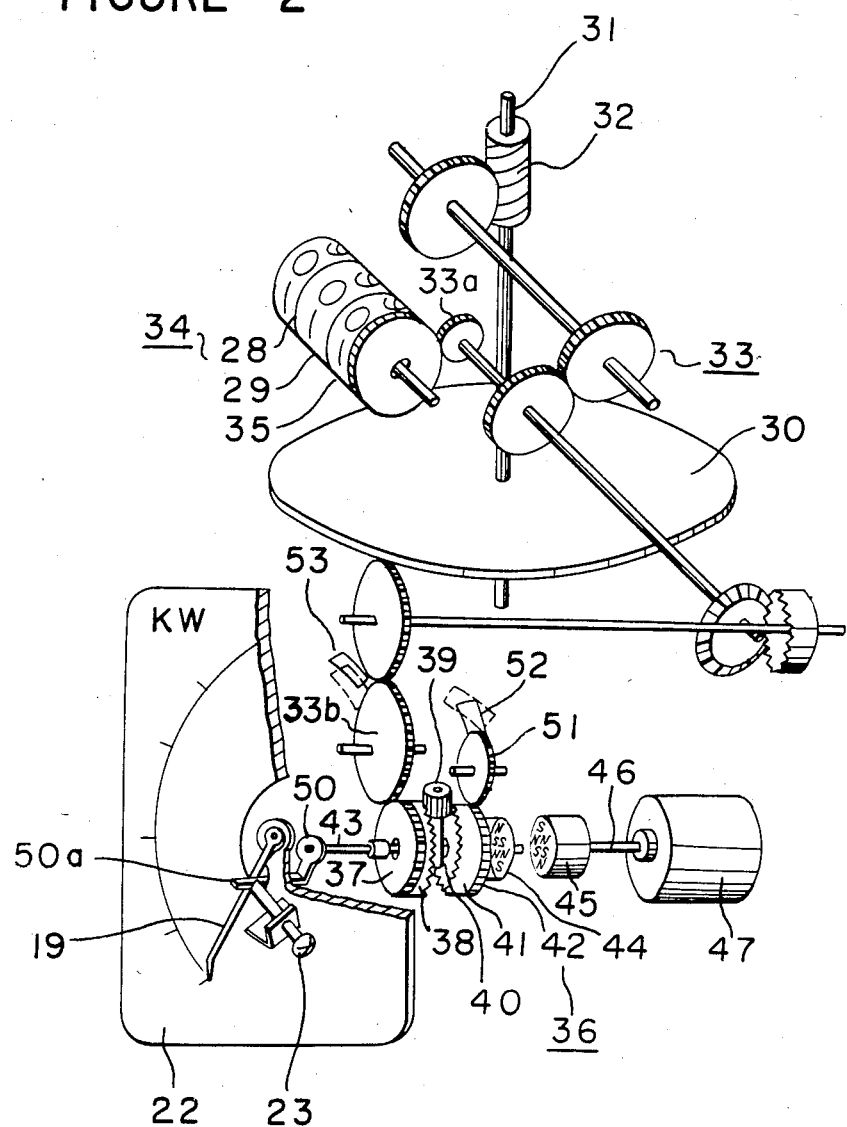
FIG. 2 is a schematic view of an embodiment of the driving part of the present invention.

In FIG. 2, the reference numeral 30 designates the rotary circular plate of an integrating wattmeter; the numeral 31 designates a shaft for holding the rotary circular shaft; the numeral 32 designates a worm fixed to the shaft 31 and the numeral 33 designates a gear train for transmitting a rotation of the worm 32 in proportion to the ratio of the number of teeth of gear wheels. The rotation of the gear train is transmitted through a first final stage gear wheel 33a to a number ring wheel 35 for the first order of the decimal system, of a counter 34 which shows an amount of electric energy consumed. The numeral 29 designates a number ring wheel for the seocnd order and 28 designates a number ring wheel for the third order. A pinion (not shown) for increasing the order of the decimal system is provided behind each of the number ring wheels.

The reference numeral 33b designates a second final stage gear wheel provided at the other end of the gear train 33; the numeral 36 designates a differential gear mechanism driven by the second final stage gear wheel 33b. The differential gear mechanism 36 comprises a first spur gear 37, a first sun gear 38 formed in one-piece with the spur gear 37, a planet gear 39 meshed with both the first sun gear 38 and a second sun gear 41, a supporting rod 20 which supports the planet gear 39 in a rotatable manner and is fixed to a center shaft 43 in a right angle, a second spur gear 42 formed in one-piece with the second sun gear 41, a first magnet 44 mounted on the side surface of the second spur gear 42, a second magnet 45 facing the first magnet 44 with a suitable space on the coaxial line, an output shaft 46 of a synchronous motor 47 for supporting the second magnet 45, a push arm 50 fixed to the center shaft 43 and having a free end 50a for moving forwardly the demand pointer 19, a control gear 51 meshing with the second spur gear 42, and first and second engaging pawls 52, 53 which in normal condition, render the control gear 51 to be in nonrotation and the second final stage gear wheel 33b to be freely rotatable as shown by the solid lines.

Figure 1:
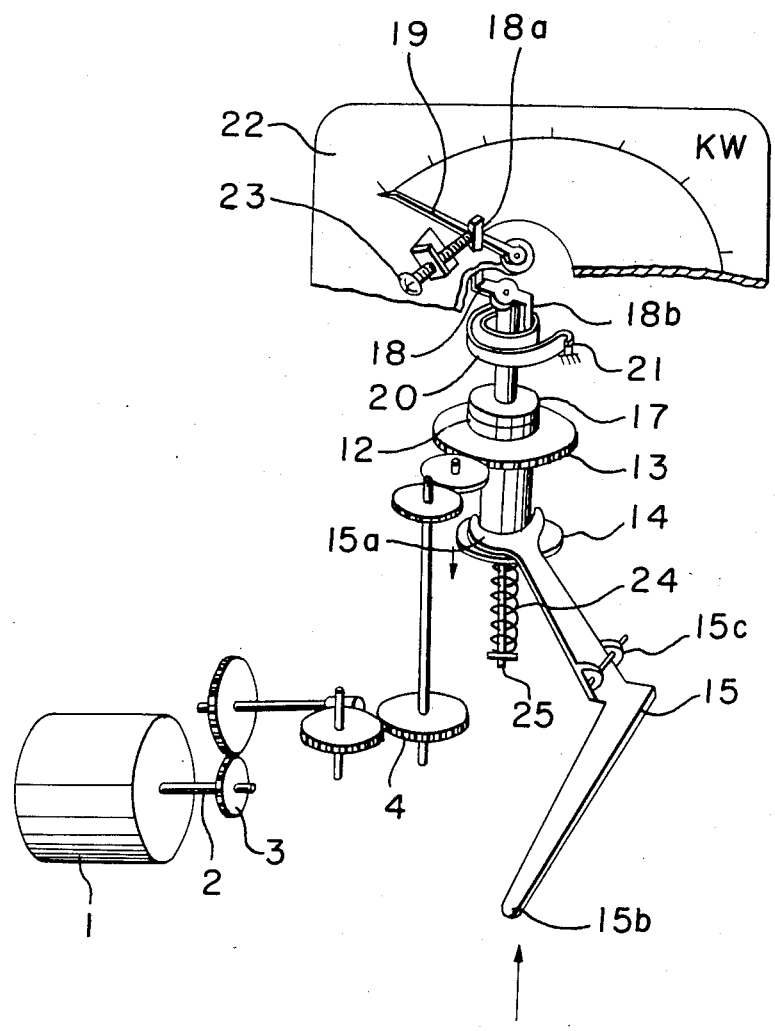
FIG. 1 is a schematic view of a driving part of the conventional maximum demand meter.

The same reference numerals designate the same parts as in FIG. 1. The description is therefore omitted.

The operation of the maximum demand meter thus constructed will be described.

As well known, the rotary circular plate 30 of the integrating wattmeter pivotally supported by a lower bearing (not shown) rotates in proportion to a consumed electric energy under the control of a driving means and a damping means (not shown). The rotation of the rotary circular plate is first transmitted to the worm 32 and through a series of the gear train 33 to the first final stage gear wheel 33a and the second final stage gear wheel 33b respectively. The first final stage gear wheel 33a rotates the number ring wheel 35 for the first order in the decimal system. Thus, the counter 34 shows a measured value (KWh) for electric energy consumed.

On the other hand, the second final stage gear wheel 33b rotates the first spur gear 37 of the differential gear mechanism 36 which in turn imparts a torque to the first sun gear 38 formed in one-piece with the spur gear in a given direction and followed by the planet gear 39.

The planet gear 39 is adapted to be rotated by the second sun gear 41. In the normal state, however, the second sun gear 41 formed in one-piece with the second spur gear 42 is kept in a non-rotational state because the control gear 51 meshed with the second spur gear 42 is locked by means of the first engaging pawl 52. Accordingly, the planet gear 39 turns around the second sun gear 41 in the fixed state, depending solely on the rotation of the first sun gear 38 in the same direction as the first sun gear 38 with the consequence that the center shaft 43 is rotated through the supporting rod 40 in the same direction as the rotation of the first sun gear 38 and the demand pointer 19 is moved forwardly by the end 50a of the push arm 50 fixed to the center shaft 43.

When a predetermined time such as fifteen minutes, thirty minutes or sixty minutes etc. has lapsed, that is, upon reaching a predetermined demand time, the first and second engaging pawls 52, 53 are moved to the positions as shown in the broken lines for a short time. Namely, the control gear 51 becomes free and the second final stage gear wheel 33b is locked to be in a non-rotational state. The engaging pawls can be moved by utilizing a force supplied by the timing device (not shown) as described hereinbefore. The first and second magnets 44, 45 are so adapted to be magnetized as shown in FIG. 2 and the second magnet 45 is rotated by the synchronous motor 47 in the direction opposite the rotation of the first sun gear 38. Therefore, with the magnetic coupling of the first and second magnets, the second sun gear 41 immediately rotates to the opposite direction to the revolution of the first sun gear 38 which is now locked, whereby the planet gear 39 rotates the center shaft 43 reversely by the operation reverse in order from the discription as described before, thereby returning the push arm to the zero position. The demand pointer 19 remains at a forward position brought by the push arm.

The timing device is again actuated in such a manner that the first and second engaging pawls 52, 53 are returned to the state as shown by the solid lines and a rotation in proportion to the rotation of the rotary circular plate of the integrating wattmeter is transmitted to the push arm 50 to cause the forward movement of the demand pointer 19. However, only when the electric energy consumed in a time period is greater than that from a previous period is the demand pointer forwardly moved. If small, the push arm 50 is returned to the zero position without contacting the demand pointer 19. Thus, the demand pointer 19 indicates the maximum value among the average electric power for each time period.

In the embodiment, the rotation of the control gear 51 and the second final stage gear wheel 33b are controlled by the switching operation of engaging pawls. Alternatively, it is possible to control the differential gear mechanism by controlling the revolution of the first and second spur gears 37, 42 directly. In this case, provision of the control gear 51 is unnecessary.

Although the first magnet 44 is attached to the side surface of the second spur gear 42, it is possible that the first magnet 44 is attached to the side surface of the control gear 51 and the second magnet 45 is placed facing the first magnet 44. Furthermore, although the synchronous motor 47 is used to rotate the second magnet 45, it is possible to utilize the revolution of a synchronous motor for the timing device to rotate the second magnet 45.

As described above, the embodiment of the present invention is so constructed that the rotation of a driving part is transmitted for proportional rotation to solely the first sun gear of a differential gear mechanism to forwardly move a push arm through the rotation of a planet gear; upon reaching a predetermined time, first and second engaging pawls are actuated to lock the rotation of the first sun gear and release the second sun gear to be free; coupling by magnetizing is effected to rotate the second sun gear in the direction opposite the first sun gear thereby causing the turning of the planet gear in the direction opposite the first sun gear to return the push arm to the zero position. With the construction, a large torque is not required for the driving part while the push arm can certainly be forwardly moved and returned to the zero position without reducing performance of the driving part. A maximum demand meter of a small size, economical and high reliability can be obtained.

Figure 3:
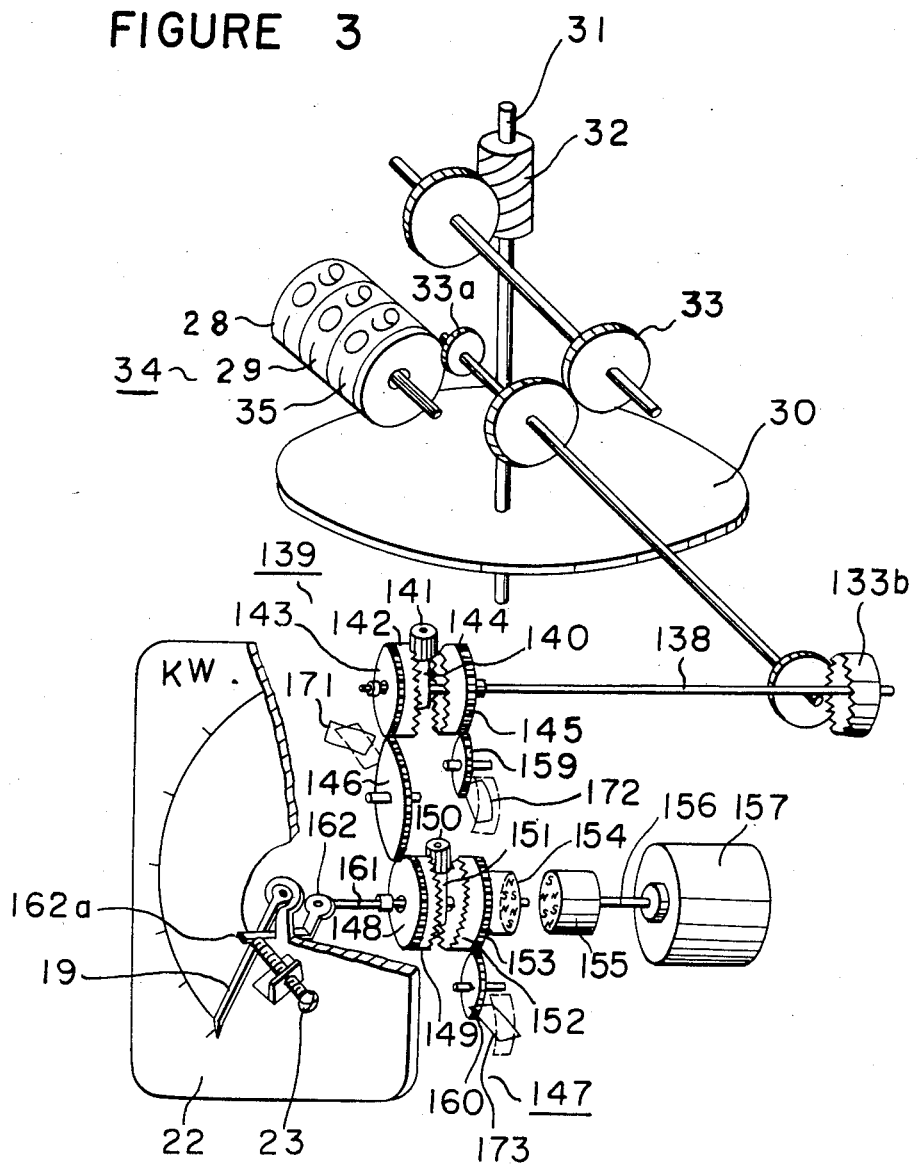
FIG. 3 is a schematic view of another embodiment of the driving part of the present invention.

Another embodiment of the present invention will be described with reference to FIG. 3. In FIG. 3, the same reference numerals as in FIG. 2 designate the same or corresponding parts. The description is therefore omitted.

The reference numeral 133b designates a second final stage gear wheel placed at the other end of the gear train 33; the numeral 138 designates a first shaft for fixedly supporting the second final stage gear wheel 133b and a first supporting rod 140 of a first differential gear mechanism 139; the numeral 141 designates a first planet gear rotatably held by the first supporting rod 140; the numerals 142 and 144 respectively designate first and second sun gears both meshed with the first planet gear 141. The first sun gear 142 is formed in one-piece with a third spur gear 143 and the second sun gear 144 is formed in one-piece with a fourth spur gear 145. The numeral 159 designates a first control gear for transmitting the rotation of the fourth spur gear 145; the numeral 146 designates a sixth spur gear for transmitting the rotation of the third spur gear 143; the numeral 147 designates a second differential gear mechanism driven by the sixth spur gear 146; the numeral 148 designates a eighth spur gear meshed with the sixth spur gear 146; the numeral 149 designates a third sun gear formed in one-piece with the eighth spur gear 148; the numeral 150 designates a second planet gear meshed with both the third sun gear 149 and a fourth sun gear 152; the numeral 151 designates a second supporting rod which supports the second planet gear 150 in a freely rotatable manner and is fixed to a center shaft 161 at a right angle; the numeral 153 designates a ninth spur gear formed in one-piece with the fourth sun gear 152; the numeral 160 designates a second control gear meshed with the ninth spur gear 153; the numeral 154 designates a first magnet attached to the side surface of the ninth spur gear 153; the numeral 155 designates a second magnet placed facing coaxially the first magnet 154 at an appropriate distance; the numeral 156 designates an output shaft of a synchronous motor 157 supporting the second magnet 155; the numeral 162 designates a push arm which is fixed to the center shaft 161 and has an end 162a for forwardly moving the demand pointer 19; the numerals 171, 172 and 173 respectively designate first, second and third engaging pawls which are so adapted that in normal condition, the first and second control gears 159, 160 are hindered from the rotation and the sixth spur gear 146 is rendered to be freely rotatable.

The operation of the embodiment will be described.

The rotary circular plate 30 of the integrating wattmeter pivotally supported by a lower bearing (not shown) rotates dependent on the consumed electric energy under the control of a driving means and a damping means (both not shown). The rotation of the rotary circular plate is transmitted to the worm 32 and it is transmitted depending on a gear ratio to both the first and second final stage gear wheels 33a and 133b through a series of the gear train 33. The first final stage gear wheel 33a rotates the number ring wheel 35 for the first order in the decimal system and thus, a measured value in proportion to the consumed electric energy is shown in the counter 34. On the other hand, the torque of the second final stage gear wheel 133b is transmitted to the first supporting rod 140 connected to the first shaft 138 and hence the torque is transmitted to the first planet gear 141 rotatably supported by the first supporting rod 140. The rotation of the first planet gear 141 is transmitted to the first and second sun gears 142, 144 respectively. However, the second sun gear 144 is kept in a non-rotational state because the first control gear 159 meshed with the fourth spur gear 145 which is formed in one-piece with the second sun gear 144, is locked by the second engaging pawl 172 as shown by the solid line. Accordingly, the first planet gear 141 turns around the second sun gear 144 in the fixed state depending on the rotation of the second final stage gear wheel 133b and the torque is transmitted solely to the first sun gear 142, thereby rotating the third spur gear 143 formed in one-piece therewith. The rotation of the third spur gear 143 is further transmitted through the sixth spur gear 146 to the eighth spur gear 148 of the second differential gear mechanism 147, whereby the third sun gear 149, formed in one-piece with the eighth spur gear 148, is rotated in a predetermined direction to transmit rotational force to the second planet gear 150. The second planet gear 150 is adapted to receive rotational force from the fourth sun gear 152. However, because the second control gear 160, meshed with the ninth spur gear 153, is hindered from the rotation by means of the third engaging pawl 173, as similar to the first control gear 159, as shown by the solid line, the second planet gear 150 turns around the fourth sun gear 152 in the same direction as the third sun gear depending on the rotation of the third sun gear. As a result, the center shaft 161 is rotated through the second supporting rod 151 in the same direction as the third sun gear 149 and the end 162a of the push arm 162 connected to the center shaft 161 moves forwardly the demand pointer 19. The sixth spur gear 146 is not hindered to rotate because the first engaging pawl 171 is shifted to the position shown by the solid line.

When a predetermined time such as fifteen minutes, thirty minutes or sixty minutes etc. has elapsed, that is, upon reaching a predetermined demand time, the first, second and third engaging pawls 171, 172 and 173 are respectively moved to the positions as shown by the broken lines for a short time. Namely, the first and second control gears 159, 160 become freely rotatable and the sixth spur gear 146 is brought into a non-rotational state.

The engaging pawls can be moved by utilizing a force supplied from the timing device as described in the first embodiment.

In the state that the first and second control gears 159, 160 are free and the sixth spur gear 146 is locked, the first and second magnets 154, 155 are magnetized as shown in FIG. 3 and the second magnet 155 is rotated by the synchronous motor 157 in the direction opposite the rotation of the third sun gear 149. Accordingly, the fourth sun gear 152 is rotated in the direction opposite the rotation of the third sun gear 149 by the magnetic coupling of the first and second magnets and the reverse movement of the second planet gear 150 causes the center shaft 161 to rotate in the opposite direction. Namely, the push arm is returned to the zero position. The demand pointer 19 remains at a forward position brought by the push arm 162 as described hereinbefore.

When the first, second and third engaging pawls 171, 172, 173 are in such position as shown by the broken lines, the rotation of the integrating wattmeter is transmitted on one hand, to the counter 34 through the gear train 33 and the first final stage gear wheel 33a and on the other hand, to the first differential gear mechanism 139 through the second final stage gear wheel 133b in which the first planet gear 141 is turned around the first sun gear 142 in a fixed state to transmit a torque to the second sun gear 144 whereby the fourth spur gear 145 and the first control gear 159 are rotated.

The rotational force does not cause any effect to the demand pointer 19. Therefore, it is ruled that non-contribution time for the demand pointer should not exceed fifteen seconds.

When the first, second and third engaging pawls 171, 172, 173 are brought into the positions by the actuation of the timing device as shown by the solid lines, the rotational force in proportion to the rotation of the rotary circular plate 30 of the integrating wattmeter is transmitted to the push arm 162. When the electric energy consumed in a time period is greater than that from a previous period, the demand pointer 19 is forwardly moved. Otherwise, the push arm is returned to the zero position without contacting the demand pointer 19. Thus, the demand pointer 19 indicates the maximum value among the average electric power for each time period.

In the second embodiment of the present invention, the rotations of the first and second control gears 159, 160 are controlled by the respective engaging pawls. It is possible to directly control the rotations of the fourth and ninth spur gears 145, 153 respectively. In such case, provision of the first and second control gears is unnecessary. Also, although the first magnet 154 is attached to the side surface of the ninth spur gear 153, it is possible to attach the first magnet on the side surface of the second control gear 160 and to place the second magnet 155 so as to face the first magnet.

In this embodiment, in order to drive the second magnet 155, the synchronous motor is used to solely drive it. Alternatively, it is possible to utilize a synchronous motor for the timing device so as to rotate the second magnet 155.

As described above, the second embodiment of the present invention is so constructed that the rotation of a rotary shaft rotated depending on electric power to be measured is transmitted to a first differential gear mechanism through a gear train; the output of the differential gear mechanism is transmitted through a second differential gear mechanism to a push arm holding a demand pointer to forwardly move the push arm, and the rotation of the zero-returning driving part is transmitted to the push arm through the second differential gear mechanism to return the push arm to the zero position. Accordingly, a large torque is not required for a driving part while the push arm can certainly be forwardly moved and returned to the zero position. Furthermore, even though non-operation time for the demand pointer is extended to some extent due to unevenness in quality of the timing device, it does not inhibit operations of measuring devices of the meter.

I claim:

1. A maximum demand meter for determining maximum average power consumption for a series of measuring periods, for use with an integrating wattmeter of the type that comprises a rotating member whose angular velocity is proportional to the rate of consumption of electric energy, said maximum demand meter comprising:
    a pointer mounted for arcuate movement;
    a push arm fixedly mounted on a center shaft for movement from a zero position to push said pointer in response to rotation of said center shaft in a first direction during a measuring period;
    first and second sun gears and a planet gear in contact therewith, said planet gear being fixedly attached to and mounted for orbital rotation about said center shaft;
    driving gear means for drivingly connecting said first sun gear with said rotating member of said wattmeter;
    zero-returning means for returning said push arm to said zero position at the end of a measuring period, said zero-returning means being coupled to said second sun gear for rotating said second sun gear at the end of a measuring period, thereby to cause said planet gear to rotate said center shaft in a second direction;
    first pawl means for selectively preventing rotation of said first sun gear during operation of said zero-returning means; and
    second pawl means for selectively preventing rotation of said second sun gear during said measuring period.

2. A maximum demand meter according to claim 1, wherein said driving gear means for drivingly connecting said first sun gear with said rotating member of said wattmeter further comprises a first spur gear fixed on said first sun gear, and wherein a second spur gear is fixed on said second sun gear and comprises means through which said second pawl means acts.

3. A maximum demand meter according to claim 1, wherein said zero-returning means comprises a first magnet attached to said second sun gear, a second magnet coaxially facing said first magnet at an appropriate distance for magnetic coupling, and a synchronous motor for rotating said second magnet.

4. A maximum demand meter according to claim 2, further comprising a control gear engaged with said second spur gear and being selectively engageable by said second pawl means, and wherein said driving gear means further comprises a final stage gear wheel in contact with said first spur gear and being selectively engageable by said first pawl means.

5. A maximum demand meter according to claim 1, wherein said first and second sun gears face each other at a distance and said planet gear is placed between said first and second sun gears to mesh with both the sun gears.

6. A maximum demand meter according to claim 5, wherein said center shaft is loosely disposed through central holes of said first and second sun gears, and a supporting rod supports said planet gear in a freely rotatable manner thereon and is fixed to said center shaft at a right angle.

7. A maximum demand meter for determining maximum average power consumption for a series of measuring periods, for use with an integrating wattmeter of the type that comprises a rotating member whose angular velocity is proportional to the rate of consumption of electric energy, said maximum demand meter comprising:
    a pointer mounted for arcuate movement;
    a push arm mounted for rotary movement in a first direction from a zero-position to push said pointer during a measuring period;
    a first differential gear mechanism comprising a first planet gear and first and second sun gears rotatable in proportion to the rotation of said first planet gear;
    driving gear means for drivingly connecting said first differential gear mechanism with said rotating member of said wattmeter;
    a second differential gear mechanism comprising a third sun gear rotationally coupled to said first sun gear, a fourth sun gear, and a planet gear;
    means joining said second planet gear and said push arm for converting orbital motion of said second planet gear into rotary motion of said push arm;
    zero-returning means for returning said push arm to said zero position at the end of a measuring period, said zero-returning means being coupled to said fourth sun gear for rotating said fourth sun gear at the end of a measuring period, thereby to cause said second planet gear to rotate said push arm in a second direction and return it to said zero position; and
    engaging pawl means for selectively preventing rotation of said second and fourth sun gears during said measuring period and for selectively preventing rotation of said first and third sun gears during operation of said zero-returning means.

8. A maximum demand meter according to claim 7, said driving gear means comprising a first shaft passing through central holes of said first and second sun gears, said first differential gear mechanism comprising:
    a supporting rod fixed on said first shaft and rotationally supporting said first planet gear, and
    a spur gear fixed on said second sun gear,
    said maximum demand meter comprising a first control gear rotationally engaged with said spur gear fixed on said second sun gear, said engaging pawl means comprising a pawl selectively engageable with said first control gear for selectively preventing rotation of said second sun gear during said measuring period.

9. A maximum demand meter according to claim 7, further comprising a spur gear fixed on said first sun gear for rotationally coupling said first sun gear and said third sun gear.

10. A maximum demand meter according to claim 7, further comprising a spur gear fixed on said third sun gear for rotationally coupling said first sun gear and said third sun gear.

11. A maximum demand meter according to claim 7, wherein said zero-returning means comprises a first magnet attached to said fourth sun gear, a second magnet coaxially facing said first magnet at an appropriate distance for magnetic coupling, and a synchronous motor for rotating said second magnet.

12. A maximum demand meter according to claim 10, further comprising:

a spur gear fixed on said fourth sun gear;

a second control gear rotationally engaged with said spur gear fixed on said fourth sun gear; and a spur gear disposed between said first and third sun gears for rotationally coupling said first and third sun gears;

said engaging pawl means comprising a pawl selectively engageable with said second control gear for preventing rotation of said fourth sun gear during said measuring period and a pawl selectively engageable with said spur gear disposed between said first and third sun gears for preventing rotation of said first and third sun gears during operation of said zero-returning means.

13. A maximum demand meter according to claim 8, wherein said first and second sun gears face each other at a distance and said planet gear is placed between said first and second sun gears to mesh therewith.

14. A maximum demand meter according to claim 7, wherein said means joining said second planet gear and said push arm comprises a center shaft which is loosely passed through central holes of said third and fourth sun gears and fixedly supports at a right angle a supporting rod which supports said second planet gear in a freely rotatable manner.

15. A maximum demand meter according to claim 7 wherein said third and fourth sun gears face each other at a distance and said second planet gear is placed between said third and fourth sun gears to mesh therewith.

* * * * *